(12) United States Patent
Tsai et al.

(10) Patent No.: US 11,184,992 B1
(45) Date of Patent: Nov. 23, 2021

(54) SERVER DEVICE (71) Applicant: Wiwynn Corporation, New Taipei (TW)

(72) Inventors: Kuo-Hua Tsai, New Taipei (TW); Wei-Hao Chen, New Taipei (TW); Chih Wei Chang, New Taipei (TW)

(73) Assignee: WIWYNN CORPORATION, New Taipei (TW)

( * ) Notice: Subject to any disclaimer, the term of this patent is extended or adjusted under 35 U.S.C. 154(b) by 0 days.

(21) Appl. No.: 17/026,034

(22) Filed: Sep. 18, 2020

(30) Foreign Application Priority Data

Jul. 9, 2020 (TW) .................................. 109123130

(51) Int. Cl.
*G08B 1/08* (2006.01)
*H05K 7/14* (2006.01)
(52) U.S. Cl.
CPC .................................. *H05K 7/1498* (2013.01)
(58) Field of Classification Search
CPC .................................................... H05K 7/1498
USPC ......................................................... 340/533
See application file for complete search history.

(56) References Cited

U.S. PATENT DOCUMENTS

| 2017/0219787 A1* | 8/2017 | Ogura | G02B 6/4272 |
| 2017/0273220 A1* | 9/2017 | Nagasaka | H05K 7/20145 |
| 2018/0287314 A1* | 10/2018 | Rothermel | H05K 1/11 |
| 2020/0389976 A1* | 12/2020 | Ganor | H05K 7/1492 |

FOREIGN PATENT DOCUMENTS

| CN | 101872247 | * 11/2012 |
| TW | 201523288 A | 6/2015 |

* cited by examiner

*Primary Examiner* — Don N Vo (57) ABSTRACT

A server device is provided. The server device includes a substrate, a first server module, a first cable, a second server module and a second cable. The first server module includes a first server board and a first recognition unit, wherein the first recognition unit is connected to the first server board. The first cable is connected to the substrate, wherein the first cable is connected to the first recognition unit, and the first recognition unit generates a first recognition signal. The second server module includes a second server board and a second recognition unit. The second recognition unit is connected to the second server board. The second cable is connected to the substrate. The second cable is connected to the second recognition unit, and the second recognition unit generates a second recognition signal. The server device determines whether the server module is coupled to the correct joint.

18 Claims, 8 Drawing Sheets

SERVER DEVICE

CROSS REFERENCE TO RELATED APPLICATIONS

This application claims priority of Taiwan Patent Application No. 109123130, filed on Jul. 9, 2020, the entirety of which is incorporated by reference herein.

BACKGROUND OF THE INVENTION

Field of the Invention

Embodiments of the present invention relates to a server device, and in particular to a server device with a plurality of server modules.

Description of the Related Art

Figure 1:
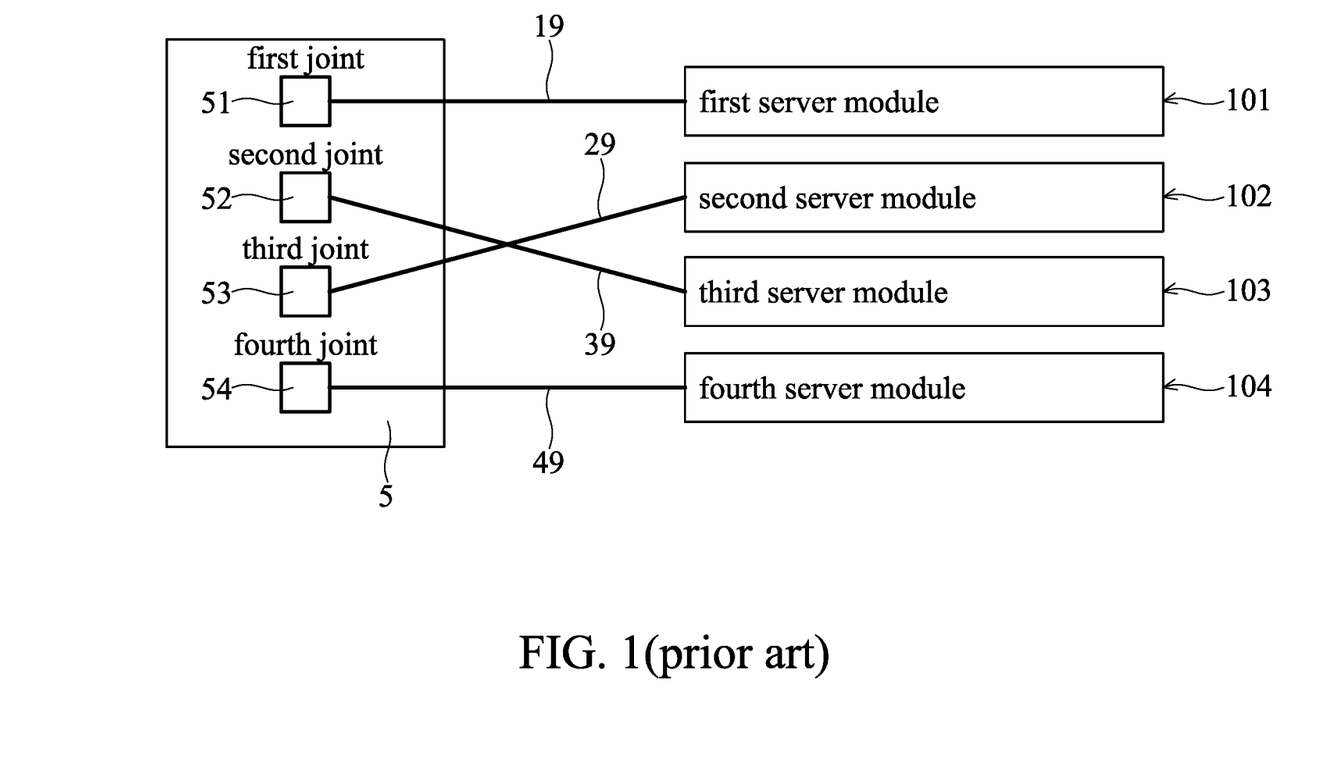
FIG. 1 shows a conventional server device, wherein the server modules are coupled to the wrong joints.

FIG. 1 shows a conventional server device, wherein the server modules are coupled to the wrong joints. With reference to FIG. 1, the conventional server device has a first server module 101, a second server module 102, a third server module 103 and a fourth server module 104. The first server module 101, the second server module 102, the third server module 103 and the fourth server module 104 are connected to a first joint 51, a second joint 52, a third joint 53 and a fourth joint 54 of the substrate 5 via a first cable 19, a second cable 29, a third cable 39 and a fourth cable 49. When the first server module 101 fails, the substrate 5 can detect that first server module 101 connected to the first joint 51 needs to be repaired. Conventionally, the substrate 5 defines the position of the server modules only according to the information of the first joint 51, the second joint 52, the third joint 53 and the fourth joint 54. When the cable is connected to the wrong joint (for example, the second cable 29 is misconnected to the third joint 53), the positioning information received by the substrate 5 is incorrect, and thus the wrong server module (normal server module) is replaced.

BRIEF SUMMARY OF THE INVENTION

Embodiments of the invention are provided to address the aforementioned difficulty.

In one embodiment, a server device is provided. The server device includes a substrate, a first server module, a first cable, a second server module and a second cable. The first server module includes a first server board and a first recognition unit, wherein the first recognition unit is connected to the first server board. The first cable is connected to the substrate, wherein the first cable is connected to the first recognition unit, the first recognition unit generates a first recognition signal, and the first cable transmits the first recognition signal to the substrate. The second server module includes a second server board and a second recognition unit, wherein the second recognition unit is connected to the second server board. The second cable is connected to the substrate, wherein the second cable is connected to the second recognition unit, the second recognition unit generates a second recognition signal, and the second cable transmits the second recognition signal to the substrate.

In one embodiment, the first recognition unit is selectively switched between a first recognition state and a second recognition state, the second recognition unit is selectively switched between the first recognition state and the second recognition state, and when the first recognition unit is in the first recognition state, the second recognition unit is in the second recognition state, and when the first recognition unit is in the second recognition state, the second recognition unit is in the first recognition state.

In one embodiment, the first recognition unit is selectively switched between a first recognition state, a second recognition state, a third recognition state and a fourth recognition state, the second recognition unit is selectively switched between the first recognition state, the second recognition state, the third recognition state and the fourth recognition state, and the recognition state of the first recognition unit differs from the recognition state of the second recognition unit.

In one embodiment, the first cable includes a first positioning signal line and a second positioning signal line, the first positioning signal line and the second positioning signal line are adapted to generate the first recognition signal.

In one embodiment, the first recognition unit includes a first riser card, the first riser card is connected to the first cable, the first riser card includes a first riser card contact and a second riser card contact, the first riser card contact is coupled to the first positioning signal line, and the second riser card contact is coupled to the second positioning signal line.

In one embodiment, in the first recognition state, the first recognition unit includes a first conductive member, and the first conductive member is connected to the first riser card contact.

In one embodiment, in the second recognition state, the first recognition unit includes a second conductive member, and the second conductive member is connected to the second riser card contact.

In one embodiment, in the third recognition state, the first recognition unit includes the first conductive member and the second conductive member, the first conductive member is connected to the first riser card contact, and the second conductive member is connected to the second riser card contact at the same time.

In one embodiment, in the fourth recognition state, the first conductive member is disconnected from the first riser card contact, and the second conductive member is also disconnected from the second riser card contact.

In one embodiment, the first server module further includes a first metal base, the first conductive member and the second conductive member are adapted to be disposed on the first metal base, and the first conductive member and the second conductive member are adapted to be coupled to the first metal base.

In one embodiment, the first conductive member includes a conductive foam or a conductive-elastic sheet.

In one embodiment, the first cable includes a first cable contact and a second cable contact, the first positioning signal line is coupled to the first cable contact, and the second positioning signal line is coupled to the second cable contact.

In one embodiment, in the first recognition state, the first recognition unit includes a first conductive member, and the first conductive member is connected to the first cable contact.

In one embodiment, in the second recognition state, the first recognition unit includes a second conductive member, and the second conductive member is connected to the second cable contact.

In one embodiment, in the third recognition state, the first recognition unit includes the first conductive member and the second conductive member, the first conductive member is connected to the first cable contact, and the second conductive member is connected to the second cable contact at the same time.

In one embodiment, in the fourth recognition state, the first conductive member is disconnected from the first cable contact, and the second conductive member is disconnected from the second cable contact.

In one embodiment, the first server module further includes a first metal base, the first conductive member and the second conductive member are adapted to be disposed on the first metal base, and the first conductive member and the second conductive member are adapted to be coupled to the first metal base.

In one embodiment, the first conductive member includes a first conductive clip, and the second conductive member includes a second conductive clip.

In one embodiment, a method for recognizing a server module connection is provided. The method includes the following steps: First, a server device is provided. The server device includes a substrate, a first server module, first cable, a second server module and a second cable. The substrate includes a substrate controller and a plurality of joints. The substrate controller is coupled to the joints. The first server module includes a first server board and a first recognition unit. The first recognition unit is connected to the first server board. The first cable is connected to the substrate via one of the joints. The first cable is connected to the first recognition unit. The second server module includes a second server board and a second recognition unit. The second recognition unit is connected to the second server board. The second cable is connected to the substrate via one of the joints. The second cable is connected to the second recognition unit. Next, the first recognition unit generates a first recognition signal, the first cable transmits the first recognition signal to the substrate, the second recognition unit generates a second recognition signal, the second cable transmits the second recognition signal to the substrate, the substrate controller receives the first recognition signal and the second recognition signal. Then, the substrate controller compares the first recognition signal and the second recognition signal to confirm whether the first cable and the second cable are connected to the correct joints.

In one embodiment, the method further includes the step that the substrate controller transmits a controller confirm result to the first server module and the second server module, and the first server module and the second server module perform a double check according to the controller confirm result.

In the server device of the embodiment of the invention, each server module corresponds to a recognition unit. The recognition unit provides the recognition signal to the substrate. The substrate therefore can automatically determine whether the server module is coupled to the correct joint according to the recognition signal. The conventional problem of repairing the wrong server module can be prevented.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

This description is made for the purpose of illustrating the general principles of embodiments of the invention and should not be taken in a limiting sense. The scope of the invention is best determined by reference to the appended claims.

Figure 2:
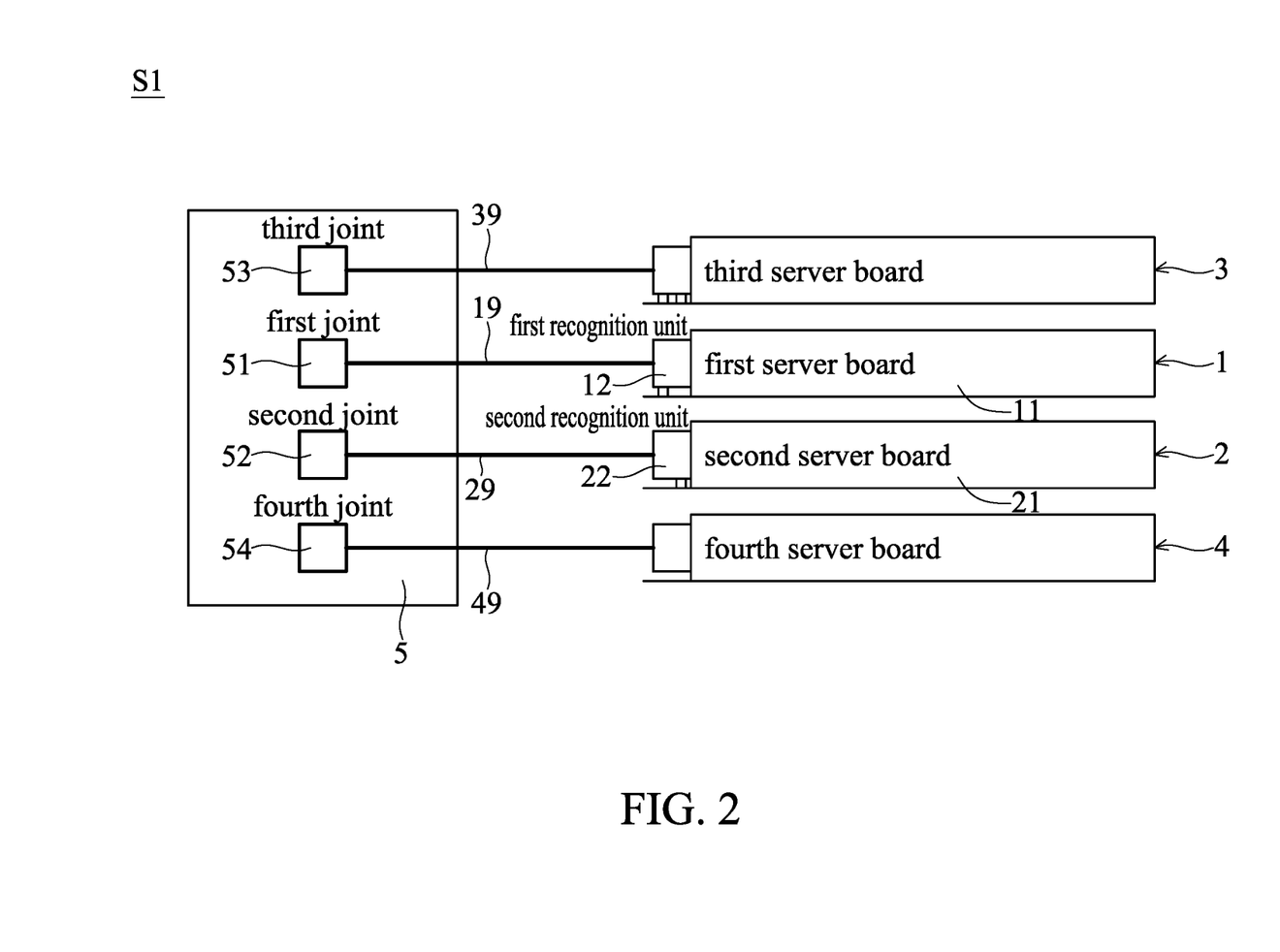
FIG. 2 shows a server device of a first embodiment of the invention.

FIG. 2 shows a server device S1 of a first embodiment of the invention. With reference to FIG. 2, the server device of the first embodiment of the invention includes a substrate 5, a first server module 1, a first cable 19, a second server module 2 and a second cable 29. The first server module 1 includes a first server board 11 and a first recognition unit 12. The first recognition unit 12 is connected to the first server board 11. The first cable 19 is connected to the substrate 5. The first cable 19 is connected to the first recognition unit 12. The first recognition unit 12 generates a first recognition signal. The first cable 19 transmits the first recognition signal to the substrate 5. The second server module 2 includes a second server board 21 and a second recognition unit 22. The second recognition unit 22 is connected to the second server board 21. The second cable 29 is connected to the substrate 5. The second cable 29 is connected to the second recognition unit 22. The second recognition unit 22 generates a second recognition signal. The second cable 29 transmits the second recognition signal to the substrate 5.

In one embodiment, the first recognition unit 12 is selectively switched between a first recognition state and a second recognition state. The second recognition unit 22 is selectively switched between the first recognition state and the second recognition state. When the first recognition unit 12 is in the first recognition state, the second recognition unit 22 is in the second recognition state. When the first recognition unit 12 is in the second recognition state, the second recognition unit 22 is in the first recognition state. Therefore, the recognition state of the first recognition unit differs from the recognition state of the second recognition unit.

With reference to FIG. 2, in the first embodiment of the invention, the first recognition unit 12 is selectively switched between a first recognition state, a second recognition state, a third recognition state and a fourth recognition state. The second recognition unit 22 is selectively switched between the first recognition state, the second recognition state, the third recognition state and the fourth recognition state. The recognition state of the first recognition unit 12 differs from the recognition state of the second recognition unit 22.

Figure 3A:
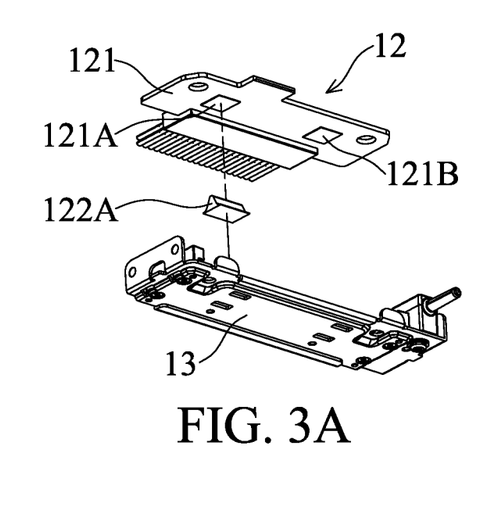
FIG. 3A shows a first recognition unit of the first embodiment of the invention, wherein the first recognition unit is in a first recognition state.

Particularly, in one embodiment, the first cable 19 includes a first positioning signal line (not shown) and a second positioning signal line (not shown). The first positioning signal line and the second positioning signal line are adapted to generate the first recognition signal. The details of the recognition units are described hereafter with the first recognition unit as an example. With reference to FIG. 3A, in one embodiment, the first recognition unit 12 includes a first riser card 121. The first riser card 121 is connected to the first cable 19. The first riser card 121 includes a first riser card contact 121A and a second riser card contact 121B. The first riser card contact 121A is coupled to the first positioning signal line. The second riser card contact 121B is coupled to the second positioning signal line.

With reference to FIG. 3A, in one embodiment, in the first recognition state, the first recognition unit 12 includes a first conductive member 122A, and the first conductive member 122A is connected to the first riser card contact 121A (in one embodiment, the recognition signal is 01).

Figure 3B:
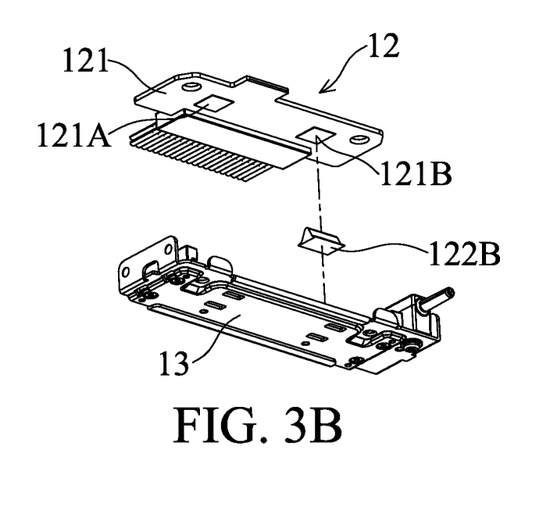
FIG. 3B shows the first recognition unit of the first embodiment of the invention, wherein the first recognition unit is in a second recognition state.

With reference to FIG. 3B, in one embodiment, in the second recognition state, the first recognition unit 12 includes a second conductive member 122B, and the second conductive member 122B is connected to the second riser card contact 121B (in one embodiment, the recognition signal is 10).

Figure 3C:
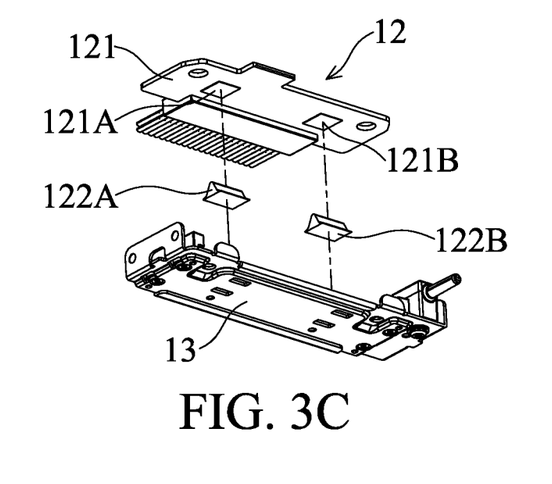
FIG. 3C shows the first recognition unit of the first embodiment of the invention, wherein the first recognition unit is in a third recognition state.

With reference to FIG. 3C, in one embodiment, in the third recognition state, the first recognition unit 12 includes the first conductive member 121A and the second conductive member 122B, the first conductive member 122A is connected to the first riser card contact 121A, and the second conductive member 122B is connected to the second riser card contact 121B at the same time (in one embodiment, the recognition signal is 00).

Figure 3D:
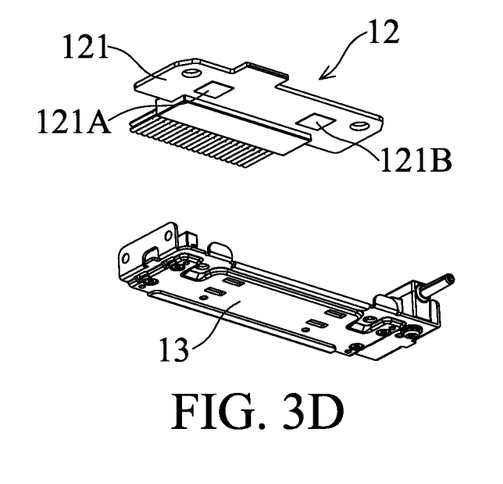
FIG. 3D shows the first recognition unit of the first embodiment of the invention, wherein the first recognition unit is in a fourth recognition state.

With reference to FIG. 3D, in one embodiment, in the fourth recognition state, the first conductive member 122A is disconnected from the first riser card contact 121A, and the second conductive member 122B is also disconnected from the second riser card contact 121B (in one embodiment, the recognition signal is 11).

With reference to FIGS. 3A, 3B, 3C and 3D, in one embodiment, the first server module 1 further includes a first metal base 13. The first conductive member 122A and the second conductive member 122B are adapted to be disposed on the first metal base 13. The first conductive member 122A and the second conductive member 122B are adapted to be coupled to the first metal base 13.

With reference to FIGS. 3A, 3B, 3C and 3D, in one embodiment, the first conductive member 122A and the second conductive member 122B can be made of conductive foam or conductive-elastic sheet. In one embodiment, the first metal base 13 is grounded. The first riser card contact 121A is grounded via the first conductive member 122A, and the second riser card contact 121B is grounded via the second conductive member 122B.

With reference to FIG. 2, the server device S1 of the first embodiment of the invention further includes a third server module 3, a third cable 39, a fourth server module 4 and a fourth cable 49. The recognition state of the first server module 1, the recognition state of the second server module 2, the recognition state of the third server module 3 and the recognition state of the fourth server module 4 are different from each other (in this embodiment, the first server module is in the first recognition state, the second server module is in the second recognition state, the third server module is in the third recognition state, and the fourth server module is in the fourth recognition state). The first server module 1 is connected to a first joint 51 of the substrate 5 via the first cable 19. The second server module 2 is connected to a second joint 52 of the substrate 5 via the second cable 29. The third server module 3 is connected to a third joint 53 of the substrate 5 via the third cable 39. The fourth server module 4 is connected to a fourth joint 54 of the substrate 5 via the fourth cable 49. In one embodiment, the substrate 5 includes a substrate controller (not shown). The substrate controller (not shown) compares the recognition signals from the first cable 19, the second cable 29, third cable 39 and the fourth cable 49 with the positions of the joints of the substrate 5 to confirm whether the first cable 19, the second cable 29, the third cable 39 and the fourth cable 49 are connected to the correct joints.

Figure 4A:
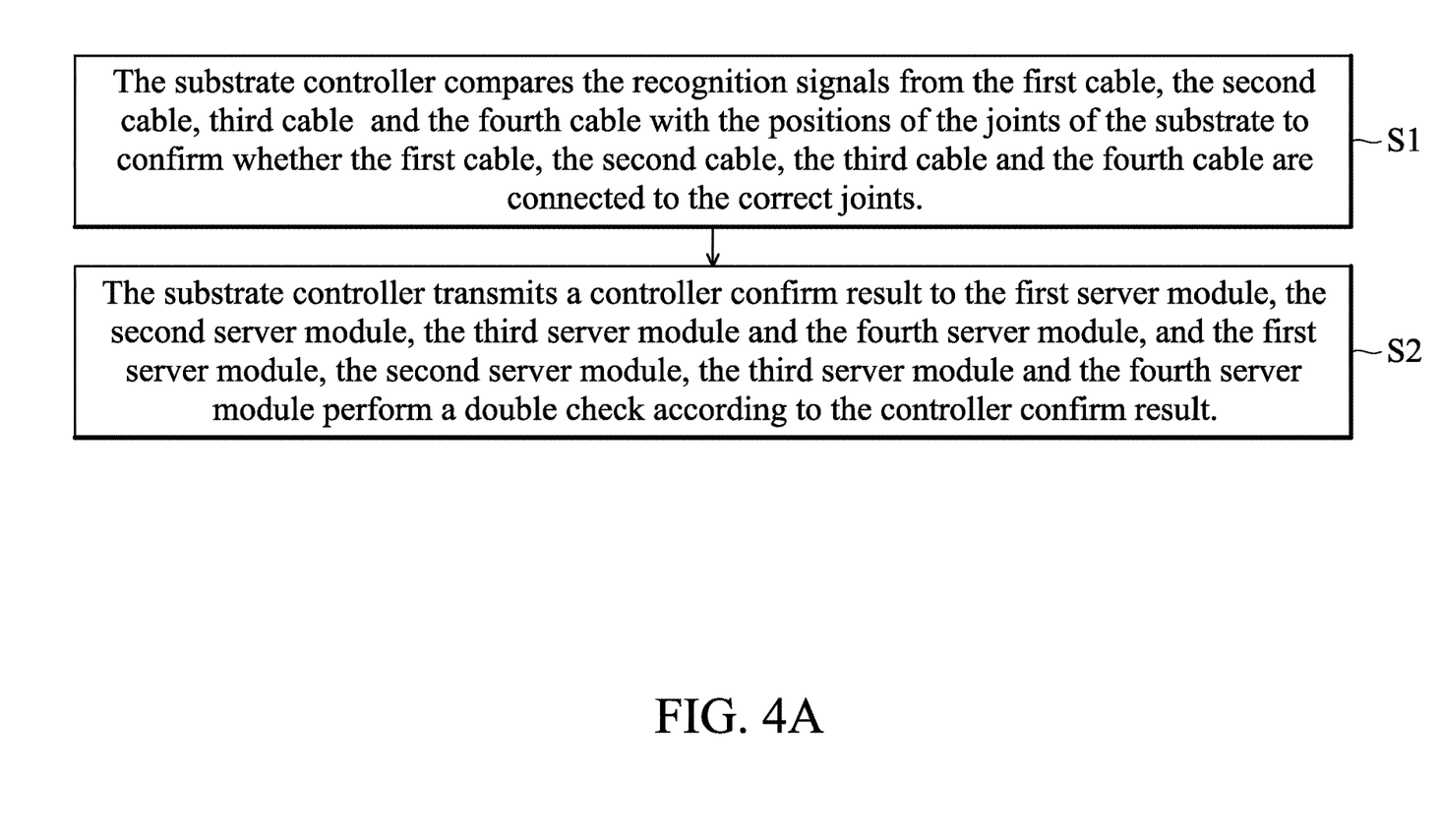
FIG. 4A shows a recognition process of the server device of the first embodiment of the invention.
Figure 4B:
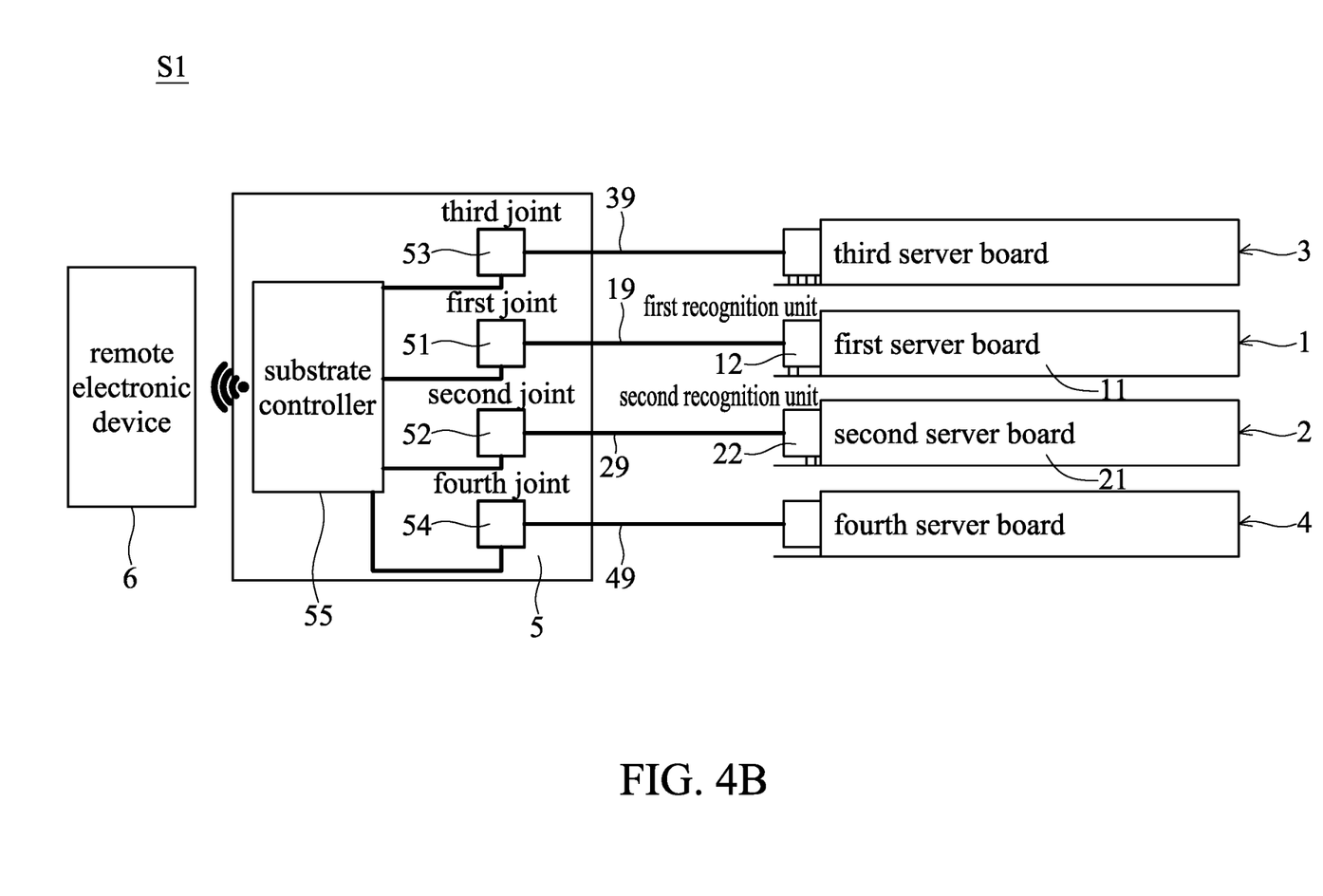
FIG. 4B shows a block diagram of the server device of the first embodiment of the invention.

FIG. 4A shows the recognition process of the server device of the first embodiment of the invention. FIG. 4B shows a block diagram of the server device of the first embodiment of the invention. With reference to FIGS. 4A and 4B, in one embodiment, after the first cable 19, the second cable 23, the third cable 39 and the fourth cable 49 are connected to the joints, the substrate controller 55 compares the recognition signals from the first cable 19, the second cable 29, third cable 39 and the fourth cable 49 with the positions of the joints of the substrate 5 to confirm whether the first cable 19, the second cable 29, the third cable 39 and the fourth cable 49 are connected to the correct joints (S1).

The substrate controller 55 transmits a controller confirm result to the first server module 1, the second server module 2, the third server module 3 and the fourth server module 4, and the first server module 1, the second server module 2, the third server module 3 and the fourth server module 4 perform a double check according to the controller confirm result (S2). In one embodiment, a remote electronic device 6 can be connected to the substrate controller 55 via internet to confirm whether the server device needs to be repaired.

Figure 4C:
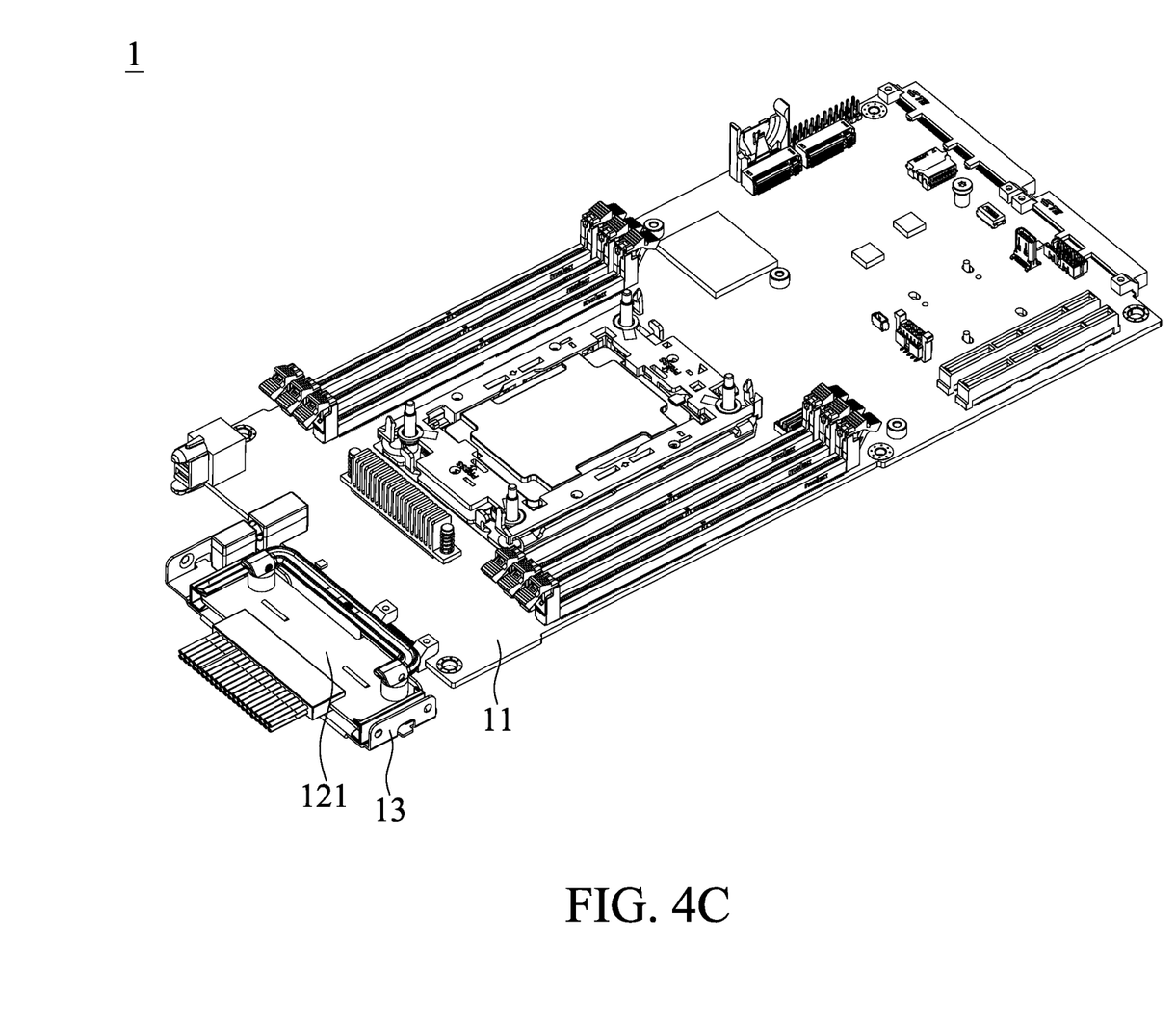
FIG. 4C shows the details of the server module of the first embodiment of the invention.

FIG. 4C shows the details of the server module of the first embodiment of the invention. With reference to FIG. 4C, in this embodiment, the first riser card 121 is connected to the first server board 11, and the first metal base 13 is connected to the first riser card 121.

Figure 5:
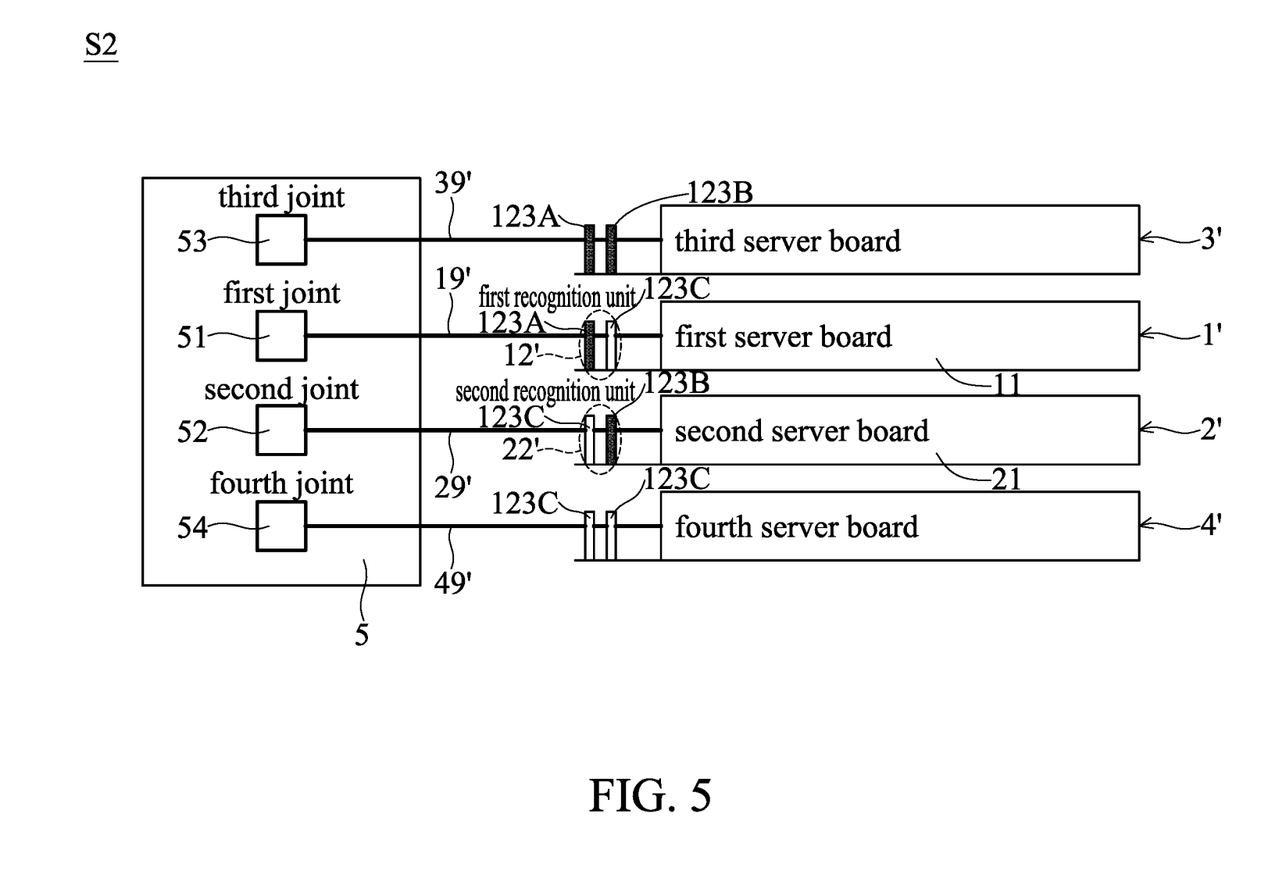
FIG. 5 shows a server device of a second embodiment of the invention.

FIG. 5 shows a server device S2 of a second embodiment of the invention. With reference to FIG. 5, the server device of the second embodiment of the invention includes a substrate 5, a first server module 1', a first cable 19', a second server module 2' and a second cable 29'. The first server module 1' includes a first server board 11 and a first recognition unit 12'. The first recognition unit 12' is connected to the first server board 11. The first cable 19' is connected to the substrate 5. The first cable 19' is connected to the first recognition unit 12'. The first recognition unit 12' generates a first recognition signal. The first cable 19' transmits the first recognition signal to the substrate 5. The second server module 2' includes a second server board 21 and a second recognition unit 22'. The second recognition unit 22' is connected to the second server board 21. The second cable 29' is connected to the substrate 5. The second cable 29' is connected to the second recognition unit 22'. The second recognition unit 22' generates a second recognition signal. The second cable 29' transmits the second recognition signal to the substrate 5.

Figure 6A:
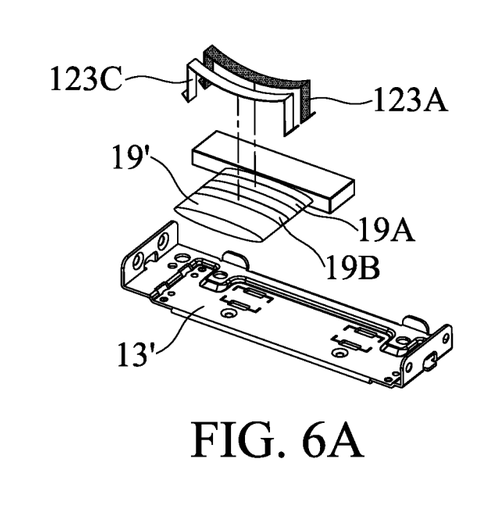
FIG. 6A shows a first recognition unit of the second embodiment of the invention, wherein the first recognition unit is in a first recognition state.

With reference to FIG. 6A, in one embodiment, the first cable 19' includes a first cable contact 19A and a second cable contact 19B. The first positioning signal line is coupled to the first cable contact 19A, and the second positioning signal line is coupled to the second cable contact 19B. In one embodiment, in the first recognition state, the first recognition unit 12' includes a first conductive member 123A, and the first conductive member 132A is connected to the first cable contact 19A.

Figure 6B:
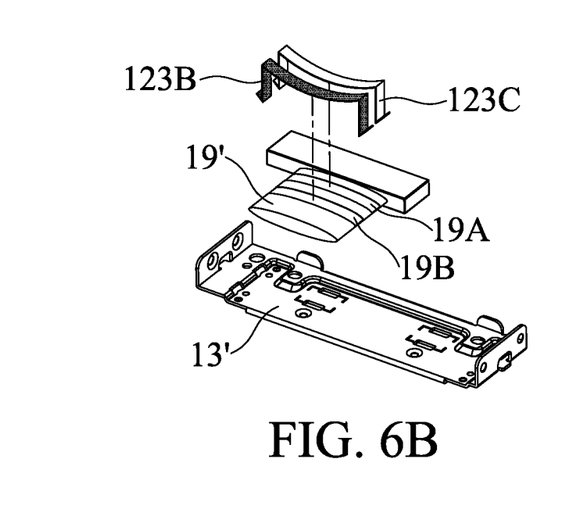
FIG. 6B shows the first recognition unit of the second embodiment of the invention, wherein the first recognition unit is in a second recognition state.

With reference to FIG. 6B, in one embodiment, in the second recognition state, the first recognition unit 12' includes a second conductive member 123B, and the second conductive member 123B is connected to the second cable contact 19B.

Figure 6C:
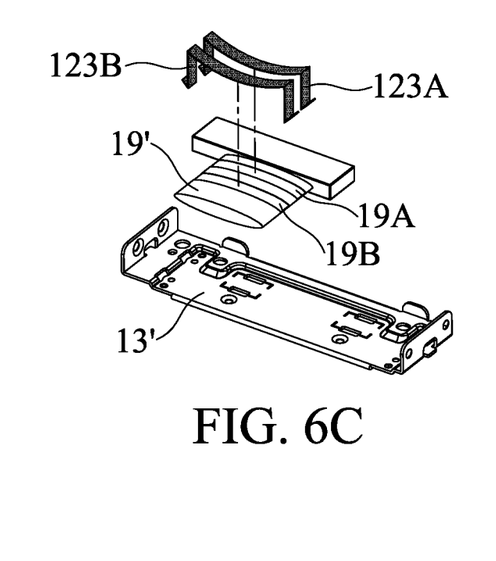
FIG. 6C shows the first recognition unit of the second embodiment of the invention, wherein the first recognition unit is in a third recognition state.

With reference to FIG. 6C, in one embodiment, in the third recognition state, the first recognition unit 12' includes the first conductive member 123A and the second conductive member 123B. The first conductive member 123A is connected to the first cable contact 19A, and the second conductive member 123B is connected to the second cable contact 19B at the same time.

Figure 6D:
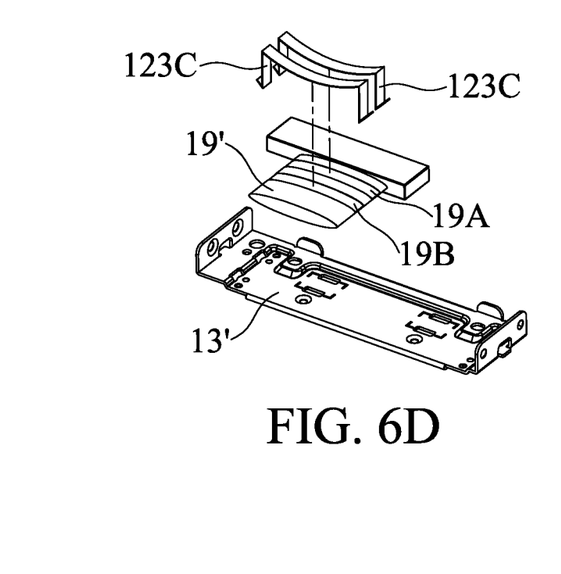
FIG. 6D shows the first recognition unit of the second embodiment of the invention, wherein the first recognition unit is in a fourth recognition state.

With reference to FIG. 6D, in one embodiment, in the fourth recognition state, the first conductive member 123A is disconnected from the first cable contact 19A, and the second conductive member 123B is disconnected from the second cable contact 19B.

With reference to FIGS. 6A, 6B, 6C and 6D, in one embodiment, the first server module 1' further includes a first metal base 13'. The first conductive member 123A and the second conductive member 123B are adapted to be disposed on the first metal base 13'. The first conductive member 123A and the second conductive member 123B are adapted to be coupled to the first metal base 13'. In one embodiment, the first metal base 13' is grounded. The first cable contact 19A is adapted to be grounded via the first conductive member 123A, and the second cable contact 19B is adapted to be grounded via the second conductive member 123B.

With reference to FIGS. 6A, 6B, 6C and 6D, in one embodiment, the first conductive member 123A includes a first conductive clip, and the second conductive member 123B includes a second conductive clip. In one embodiment, the first server module 1 can further includes non-conductive clips 123C. The non-conductive clips 123C are utilized to fasten the first cable 19'.

In the server device of the embodiment of the invention, each server module corresponds to a recognition unit. The recognition unit provides the recognition signal to the substrate. The substrate therefore can automatically determine whether the server module is coupled to the correct joint according to the recognition signal. The conventional problem of repairing the wrong server module can be prevented.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A server device, comprising:
    a substrate;
    a first server module, comprising a first server board and a first recognition unit, wherein the first recognition unit is connected to the first server board;
    a first cable, connected to the substrate, wherein the first cable is connected to the first recognition unit, the first recognition unit generates a first recognition signal, and the first cable transmits the first recognition signal to the substrate;
    a second server module, comprising a second server board and a second recognition unit, wherein the second recognition unit is connected to the second server board; and
    a second cable, connected to the substrate, wherein the second cable is connected to the second recognition unit, the second recognition unit generates a second recognition signal, and the second cable transmits the second recognition signal to the substrate,
    wherein the first recognition unit is selectively switched between a first recognition state and a second recognition state, the second recognition unit is selectively switched between the first recognition state and the second recognition state, and when the first recognition unit is in the first recognition state, the second recognition unit is in the second recognition state, and when the first recognition unit is in the second recognition state, the second recognition unit is in the first recognition state.

2. The server device as claimed in claim 1, wherein the first recognition unit is selectively switched between the first recognition state, the second recognition state, a third recognition state and a fourth recognition state, the second recognition unit is selectively switched between the first recognition state, the second recognition state, the third recognition state and the fourth recognition state, and the recognition state of the first recognition unit differs from the recognition state of the second recognition unit.

3. The server device as claimed in claim 2, wherein the first cable comprises a first positioning signal line and a second positioning signal line, the first positioning signal line and the second positioning signal line are adapted to generate the first recognition signal.

4. The server device as claimed in claim 3, wherein the first recognition unit comprises a first riser card, the first riser card is connected to the first cable, the first riser card comprises a first riser card contact and a second riser card contact, the first riser card contact is coupled to the first positioning signal line, and the second riser card contact is coupled to the second positioning signal line.

5. The server device as claimed in claim 4, wherein in the first recognition state, the first recognition unit comprises a first conductive member, and the first conductive member is connected to the first riser card contact.

6. The server device as claimed in claim 5, wherein in the second recognition state, the first recognition unit comprises a second conductive member, and the second conductive member is connected to the second riser card contact.

7. The server device as claimed in claim 6, wherein in the third recognition state, the first recognition unit comprises the first conductive member and the second conductive member, the first conductive member is connected to the first riser card contact, and the second conductive member is connected to the second riser card contact at the same time.

8. The server device as claimed in claim 7, wherein in the fourth recognition state, the first conductive member is disconnected from the first riser card contact, and the second conductive member is also disconnected from the second riser card contact.

9. The server device as claimed in claim 8, wherein the first server module further comprises a first metal base, the first conductive member and the second conductive member are adapted to be disposed on the first metal base, and the first conductive member and the second conductive member are adapted to be coupled to the first metal base.

10. The server device as claimed in claim 9, wherein the first conductive member comprises a conductive foam or a conductive-elastic sheet.

11. The server device as claimed in claim 3, wherein the first cable comprises a first cable contact and a second cable contact, the first positioning signal line is coupled to the first cable contact, and the second positioning signal line is coupled to the second cable contact.

12. The server device as claimed in claim 11, wherein in the first recognition state, the first recognition unit comprises a first conductive member, and the first conductive member is connected to the first cable contact.

13. The server device as claimed in claim 12, wherein in the second recognition state, the first recognition unit comprises a second conductive member, and the second conductive member is connected to the second cable contact.

14. The server device as claimed in claim 13, wherein in the third recognition state, the first recognition unit comprises the first conductive member and the second conductive member, the first conductive member is connected to the first cable contact, and the second conductive member is connected to the second cable contact.

15. The server device as claimed in claim 14, wherein in the fourth recognition state, the first conductive member is disconnected from the first cable contact, and the second conductive member is disconnected from the second cable contact.

16. The server device as claimed in claim 15, wherein the first server module further comprises a first metal base, the first conductive member and the second conductive member are adapted to be disposed on the first metal base, and the first conductive member and the second conductive member are adapted to be coupled to the first metal base.

17. The server device as claimed in claim 16, wherein the first conductive member comprises a first conductive clip, and the second conductive member comprises a second conductive clip.

18. A method for recognizing a server module connection, comprising:

providing a server device, wherein the server device comprises a substrate, a first server module, first cable, a second server module and a second cable, the substrate comprises a substrate controller and a plurality of joints, the substrate controller is coupled to the joints, the first server module comprises a first server board and a first recognition unit, the first recognition unit is connected to the first server board, the first cable is connected to the substrate via one of the joints, the first cable is connected to the first recognition unit, the second server module comprises a second server board and a second recognition unit, the second recognition unit is connected to the second server board, the second cable is connected to the substrate via one of the joints, and the second cable is connected to the second recognition unit;

the first recognition unit generating a first recognition signal, the first cable transmitting the first recognition signal to the substrate, the second recognition unit generating a second recognition signal, the second cable transmitting the second recognition signal to the substrate, the substrate controller receiving the first recognition signal and the second recognition signal;

the substrate controller comparing the first recognition signal and the second recognition signal to confirm whether the first cable and the second cable are connected to the correct joints; and the substrate controller transmitting a controller confirm result to the first server module and the second server module, and the first server module and the second server module performing a double check according to the controller confirm result.

\* \* \* \* \*